(12) United States Patent
Tang et al.

(10) Patent No.: US 11,582,871 B2
(45) Date of Patent: Feb. 14, 2023

(54) CIRCUIT BOARD WITH HEAT DISSIPATION FUNCTION AND METHOD FOR MANUFACTURING THE SAME

(71) Applicants: Hong Heng Sheng Electronical Technology (HuaiAn) Co., Ltd., Huaian (CN); Avary Holding (Shenzhen) Co., Limited., Shenzhen (CN)

(72) Inventors: Pan Tang, Huaian (CN); Fu-Lin Chang, New Taipei (TW)

(73) Assignees: Hong Heng Sheng Electronical Technology (HuaiAn) Co., Ltd., Huaian (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/383,853

(22) Filed: Jul. 23, 2021

(65) Prior Publication Data
US 2023/0007780 A1 Jan. 5, 2023

(30) Foreign Application Priority Data
Jul. 5, 2021 (CN) .......................... 202110758492.0

(51) Int. Cl.
*H01L 23/00* (2006.01)
*H01L 23/38* (2006.01)
(Continued)

(52) U.S. Cl.
CPC ......... *H05K 3/0094* (2013.01); *H05K 1/0206* (2013.01); *H05K 3/241* (2013.01)

(58) Field of Classification Search
CPC .... H05K 1/0206; H05K 3/241; H05K 3/0094; H05K 3/3436; H05K 2201/10106; H01L 21/563; H01L 23/00; H01L 23/38; H01L 23/50; H01L 23/481; H01L 23/528; H01L 33/00; H01L 33/44; H01L 33/48;
(Continued)

(56) References Cited

U.S. PATENT DOCUMENTS

| 2011/0291148 A1* | 12/2011 | Sugizaki | H01L 33/44 |
| | | | 257/E33.056 |
| 2011/0291149 A1* | 12/2011 | Sugizaki | H01L 33/647 |
| | | | 257/E33.057 |

(Continued)

*Primary Examiner* — Xiaoliang Chen
(74) *Attorney, Agent, or Firm* — ScienBiziP, P.C.

(57) ABSTRACT

A circuit board with improved heat dissipation function and a method for manufacturing the circuit board are provided. The method includes providing a first metal layer defining a first slot; forming a first adhesive layer in the first slot; electroplating copper on each first pillar to form a first heat conducting portion; forming a first insulating layer on the first adhesive layer having the first heat conducting portion, and defining a first blind hole in the first insulating layer; filling the first blind hole with thermoelectric separation metal to form a second heat conducting portion; forming a first wiring layer on the first insulating layer; forming a second insulating layer on the first wiring layer, defining a second blind hole on the second insulating layer; electroplating copper in the second blind hole to form a third heat conducting portion; mounting an electronic component on the second insulating layer.

10 Claims, 17 Drawing Sheets

(51) Int. Cl.
    *H01L 23/50*     (2006.01)
    *H01L 23/528*     (2006.01)
    *H01L 33/00*     (2010.01)
    *H01L 33/44*     (2010.01)
    *H01L 33/48*     (2010.01)
    *H01L 33/56*     (2010.01)
    *H01L 33/62*     (2010.01)
    *H05K 3/00*     (2006.01)
    *H05K 1/02*     (2006.01)
    *H05K 3/24*     (2006.01)

(58) Field of Classification Search
    CPC ....... H01L 33/56; H01L 33/62; H01L 33/486;
               H01L 33/647; H01L 2224/05644; H01L
                  2224/13139; H01L 2224/16238; H01L
                  2224/26175; H01L 2224/48247; H01L
                                      2224/80357
    USPC ............. 174/252, 250; 257/99; 29/829, 846;
                                                438/26
    See application file for complete search history.

(56) References Cited

U.S. PATENT DOCUMENTS

| | | | |
|---|---|---|---|
| 2019/0245543 A1* | 8/2019 | Lee | ..................... H01L 27/1112 |
| 2021/0043557 A1* | 2/2021 | Lee | ..................... H01L 23/481 |

\* cited by examiner

CIRCUIT BOARD WITH HEAT DISSIPATION FUNCTION AND METHOD FOR MANUFACTURING THE SAME

FIELD

The disclosure relates to printed circuit boards, and more particularly, to a circuit board with improved heat dissipation function and a method for manufacturing the circuit board.

BACKGROUND

Circuit boards may have electronic components that generate heat during operation. If the heat cannot be dissipated quickly, a safety performance and a service life of the circuit board may be compromised.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only some and not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments, and are not intended to limit the present disclosure. The term "and/or" as used herein includes any combination of one or more related items.

In the embodiments of the present disclosure, and not as a limitation of the present disclosure, the term "connection" used in the specification and claims of the present disclosure is not limited to physical or mechanical connection, no matter direct connection or indirect connection. The terms of "up", "down", "above", "below", "left", "right", etc., are only used to indicate the relative position relationship. When the absolute position of a described element changes, the relative positions correspondingly changes.

A method for manufacturing a circuit board is disclosed in an embodiment. The method is provided by way of example, as there are a variety of ways to carry out the method. The method can begin at step 1.

Figure 1:
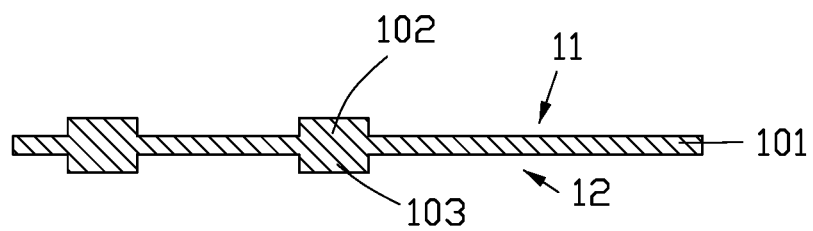
FIG. 1 is a diagrammatic view of an embodiment of a first metal layer according to the present disclosure.

At step 1, referring to FIG. 1, a first metal layer 10 is provided.

In an embodiment, the first metal layer 10 includes a main body 101, a number of first pillars 102, and a number of second pillars 103. The first pillars 102 and the second pillars 103 protrude from two opposite surfaces of the main body 101. A first slot 11 is defined between the main body 101 and two adjacent first pillars 102, and a second slot 12 is defined between the main body 101 and two adjacent second pillars 103. In an embodiment, the first pillars 102 and the second pillars 103 are aligned with each other in a thickness direction of the first metal layer 10.

The first metal layer 10 is made of a thermoelectric separation metal. The thermoelectric separation means that thermal (heat) and electricity are independent from each other, and heat and electric are transmitted in the first metal layer 10 at different positions. In an embodiment, the first metal layer 10 is made of aluminum nitride or potassium nitride. The first metal layer 10 has good heat conductive performance and electric conductive performance.

Figure 2:
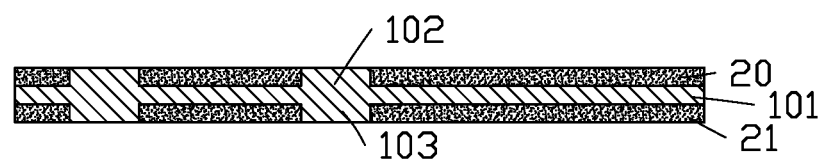
FIG. 2 is a diagrammatic view wherein a first adhesive layer and a second adhesive layer are formed on the first metal layer of FIG. 1.

At step 2, referring to FIG. 2, a first adhesive layer 20 and a second adhesive layer 21 are formed in the first slot 11 and the second slot 12, respectively.

A surface of the first adhesive layer 20 away from the main body 101 and a surface of the first pillar 102 away from the main body 101 are substantially flush with each other. A surface of the second adhesive layer 21 away from the main body 101 and a surface of the second pillar 103 away from the main body 101 are substantially flush with each other.

Figure 3:
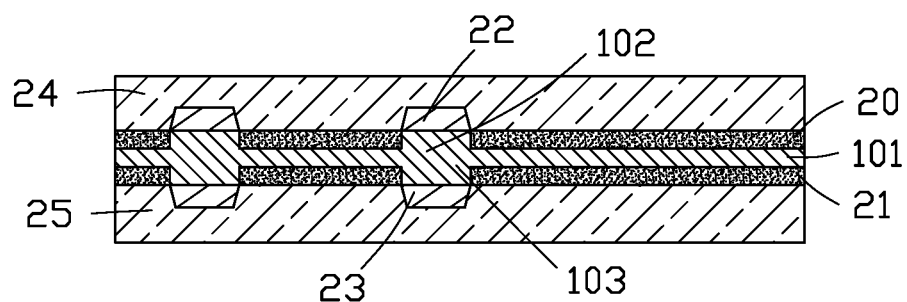
FIG. 3 is a diagrammatic view wherein a first heat conducting portion and a first heat conducting member are formed on the first metal layer, a first insulating layer is formed on the first adhesive layer, and a fourth insulating layer is formed on the second adhesive layer of FIG. 2, to form a first intermediate body.

At step 3, referring to FIG. 3, copper is electroplated on each of the first pillars 102 and each of the second pillars 103 to form a first heat conducting portion 22 and a first heat conducting member 23. The first heat conducting portion 22 is in thermal conduction with the first pillar 102, and the first heat conducting member 23 is in thermal conduction with the second pillar 103.

A first insulating layer 24 is formed on the first adhesive layer 20 having the first heat conducting portion 22, and a fourth insulating layer 25 is formed on the second adhesive layer 21 having the first heat conducting member 23. Then, a first intermediate body 30 is obtained.

Each of the first insulating layer 24 and the fourth insulating layer 25 can be made of a material selected from epoxy resin, polypropylene (PP), BT resin, polyphenylene oxide (PPO), Polyimide (PI), polyethylene Terephthalate (PET), polyethylene naphthalate (PEN), and any combination thereof. In an embodiment, the first insulating layer 24 and the fourth insulating layer 25 are both made of polypropylene.

Figure 4:
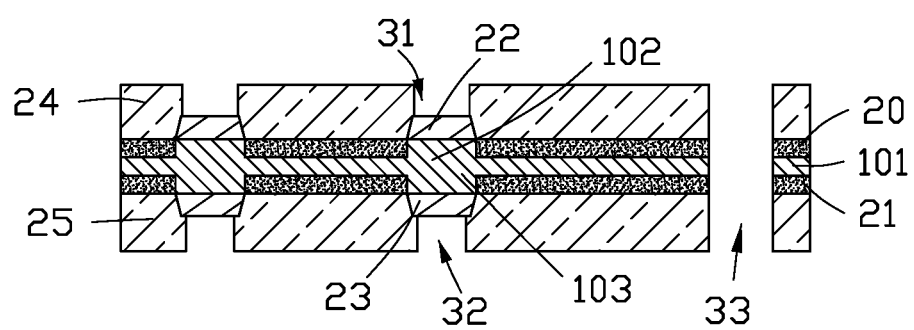
FIG. 4 is a diagrammatic view wherein a first blind hole, a first blind groove, and a through hole are defined in the first intermediate body of FIG. 3.

At step 4, referring to FIG. 4, a first blind hole 31, a first blind groove 32, and a through hole 33 are defined in the first intermediate body 30. The first blind hole 31 penetrates the first insulating layer 24, and a bottom of the first blind hole 31 corresponds to the first heat conducting portion 22. The first blind groove 32 penetrates the fourth insulating layer 25, and a bottom of the first blind groove 32 corresponds to the first heat conducting member 23. The through hole 33 sequentially penetrates the first insulating layer 24, the first adhesive layer 20, the main body 101, the second adhesive layer 21, and the fourth insulating layer 25.

In an embodiment, the first blind hole 31, the first blind groove 32, and the through hole 33 may all be formed by laser drilling.

Figure 5:
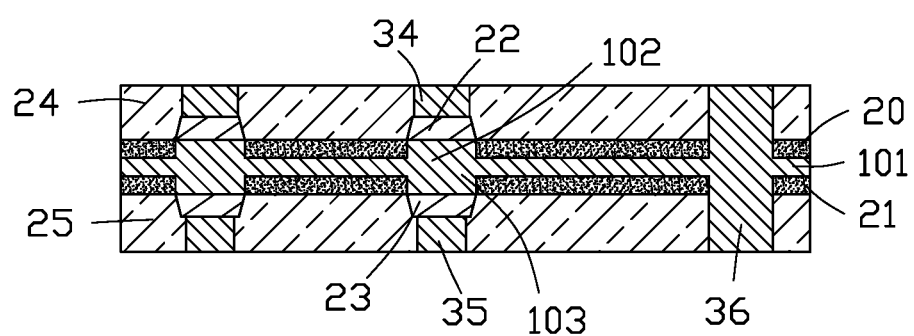
FIG. 5 is a diagrammatic view wherein a second heat conducting portion, a second heat conducting member, and a first heat conducting channel are respectively formed in the first blind hole, the first blind groove, and the through hole of FIG. 4.

At step 5, referring to FIG. 5, a thermoelectric separation metal is filled in the first blind hole 31, the first blind groove 32, and the through hole 33 to form a second heat conducting portion 34, a second heat conducting member 35, and a first heat conducting channel 36.

The second heat conducting portion 34 is in thermal conduction with the first heat conducting portion 22. The second heat conducting member 35 is in thermal conduction with the first heat conducting member 23. The first heat conducting channel 36 is in thermal conduction with the main body 101.

In an embodiment, the thermoelectric separation metal is aluminum nitride or potassium nitride.

Figure 6:
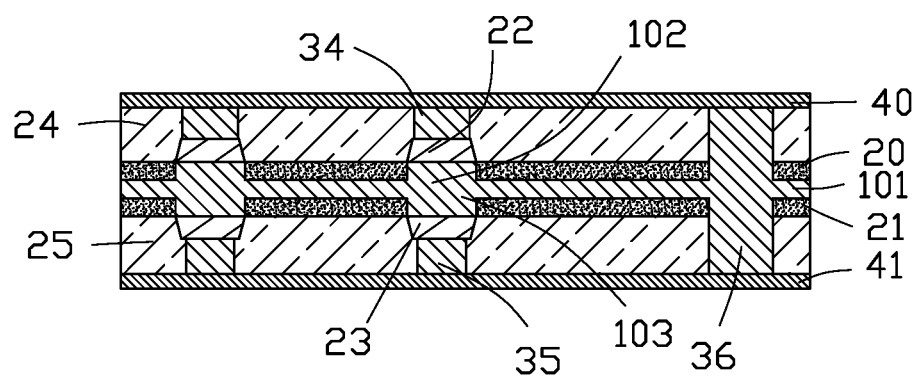
FIG. 6 is a diagrammatic view wherein a first copper foil layer and a second copper foil layer are respectively formed on the first insulating layer and the fourth insulating layer of FIG. 5.

At step 6, referring to FIG. 6, a first copper foil layer 40 and a second copper foil layer 41 are formed on the first insulating layer 24 and the fourth insulating layer 25, respectively.

Figure 7:
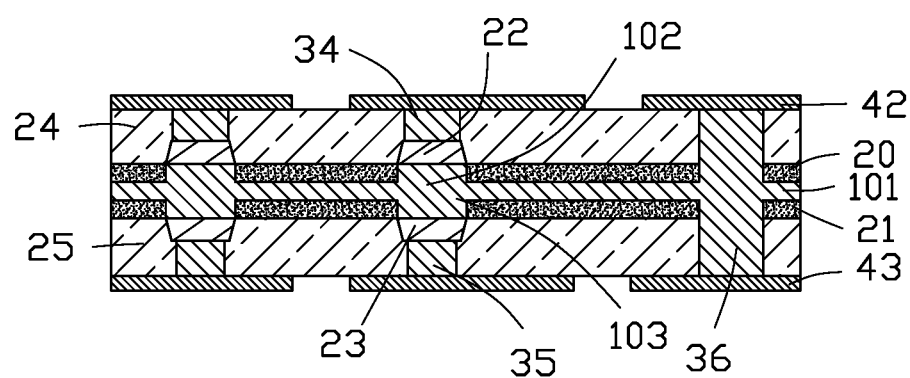
FIG. 7 is a diagrammatic view wherein the first copper foil layer and the second copper foil layer of FIG. 6 are etched to respectively form a first wiring layer and a fourth wiring layer.

At step 7, referring to FIG. 7, the first copper foil layer 40 and the second copper foil layer 41 are etched to form a first wiring layer 42 and a fourth wiring layer 43, respectively.

The first wiring layer 42 is in thermal conduction with the second heat conducting portion 34, so that the heat generated by the first wiring layer 42 can pass through the second heat conducting portion 34 and the first heat conducting portion 22 in sequence to the first metal layer 10. Since the first metal layer 10 is made of metal, the first metal layer 10 can absorb the heat or dissipate the heat to the outside environment, so that the temperature of the first wiring layer 42 can be decreased. Furthermore, the first heat conducting portion 22 made of copper and the second heat conducting portion 34 made of thermoelectric separation metal are alternately arranged, since copper is lower in cost than the thermoelectric separation metal, the heat dissipation requirements can be meet while reducing the production cost.

The fourth wiring layer 43 is in thermal conduction with the second heat conducting member 35, so that the heat generated by the fourth wiring layer 43 can pass through the second heat conducting member 35 and the first heat conducting member 23 in sequence to the first metal layer 10. The first metal layer 10 can also absorb the heat or dissipate the heat to the outside environment, so that the temperature of the fourth wiring layer 43 can be decreased. Furthermore, the first heat conducting member 23 made of copper and the second heat conducting member 35 made of thermoelectric separation metal are alternately arranged, since the copper is lower in cost than the thermoelectric separation metal, the heat dissipation requirements can be meet while reducing the production cost.

Figure 8:
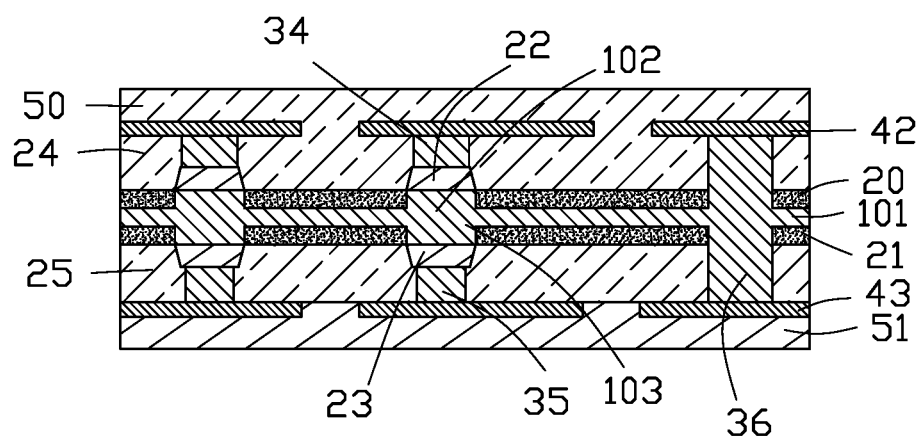
FIG. 8 is a diagrammatic view wherein a second insulating layer and a second metal layer are respectively formed on the first wiring layer and the fourth wiring layer of FIG. 7.

At step 8, referring to FIG. 8, a second insulating layer 50 and a second metal layer 51 are formed on the first wiring layer 42 and the fourth wiring layer 43, respectively.

The second insulating layer 50 can be made of a material the same as the that of the first insulating layer 24.

The second metal layer 51 is in thermal conduction with the fourth wiring layer 43. In an embodiment, the second metal layer 51 is made of a thermoelectric separation metal.

Figure 9:
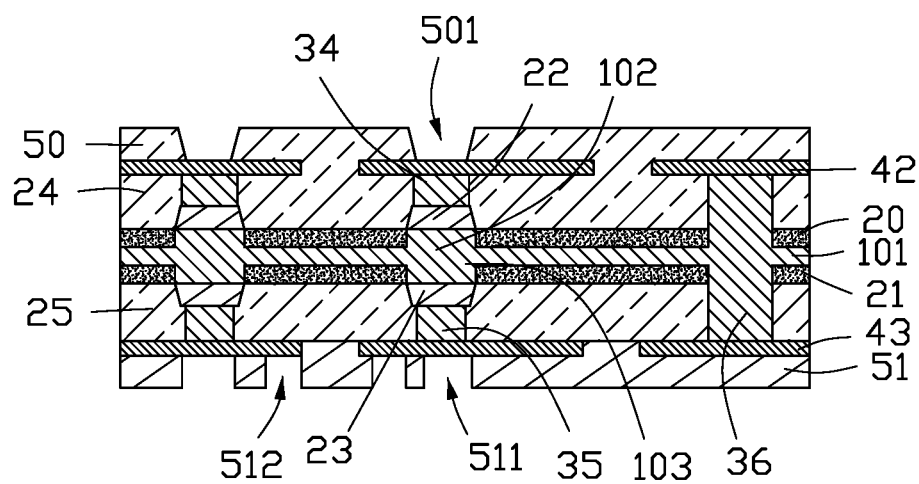
FIG. 9 is a diagrammatic view wherein a second blind hole is defined in the second insulating layer, and a second blind groove and a third blind groove are defined in the second metal layer of FIG. 8.

At step 9, referring to FIG. 9, a second blind hole 501 is defined in the second insulating layer 50. A second blind groove 511 and a third blind groove 512 are defined in the second metal layer 51.

The second blind hole 501 penetrates the second insulating layer 50, and a bottom of the second blind hole 501 corresponds to the first wiring layer 42. The second blind hole 501 corresponds to the first blind hole 31. The second blind groove 511 penetrates the second metal layer 51, and a bottom of the second blind groove 511 corresponds to the fourth wiring layer 43. The second blind groove 511 corresponds to the first blind groove 32. The third blind groove 512 penetrates the second metal layer 51, and a bottom of the third blind groove 512 corresponds to the fourth wiring layer 43. The third blind groove 512 and the first blind groove 32 are staggered (misaligned) with each other.

Figure 10:
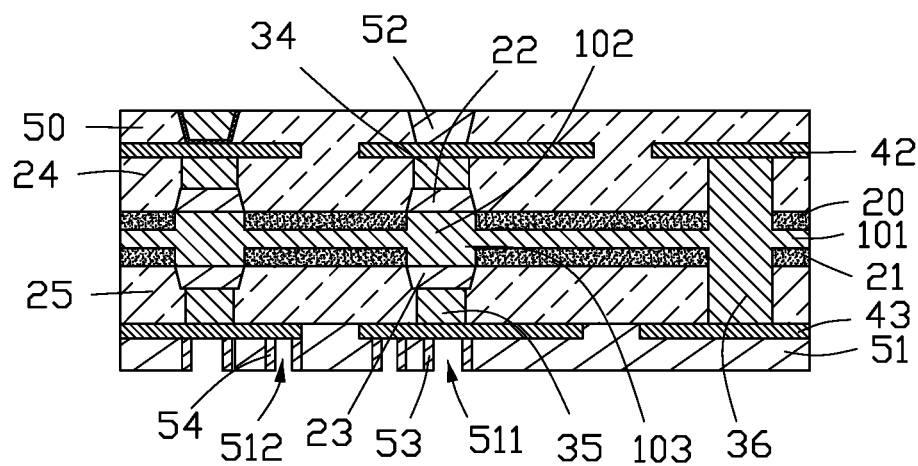
FIG. 10 is a diagrammatic view wherein a third heat conducting portion, a third heat conducting member, and a fourth heat conducting member are respectively formed in the second blind hole, the second blind groove, and the third blind groove of FIG. 9.

At step 10, referring to FIG. 10, copper is electroplated in the second blind hole 501, the second blind groove 511, and the third blind groove 512 to form a third heat conducting portion 52, a third heat conducting member 53, and a fourth heat conducting member 54.

As shown in FIG. 10, the electroplated copper completely infills one second blind holes 501 to form the third heat conducting portion 52. The electroplated copper is only disposed on the sidewall and the bottom of the second blind hole 501. As such, the thermoelectric separation metal can further infill the second blind hole 501 having the electroplated copper, so that the electroplated copper and the thermoelectric separation metal in the second blind hole 501 cooperatively form the third heat conducting portion 52. The third heat conducting portion 52 is in thermal conduction with the first wiring layer 42.

In an embodiment, the third heat conducting member 53 is disposed on the sidewall of the second blind groove 511. The third heat conducting member 53 is in thermal conduction with the fourth wiring layer 43.

In an embodiment, the fourth heat conducting portion 54 is disposed on the sidewall of the third blind groove 512. The fourth heat conducting portion 54 is in thermal conduction with the fourth wiring layer 43.

Figure 11:
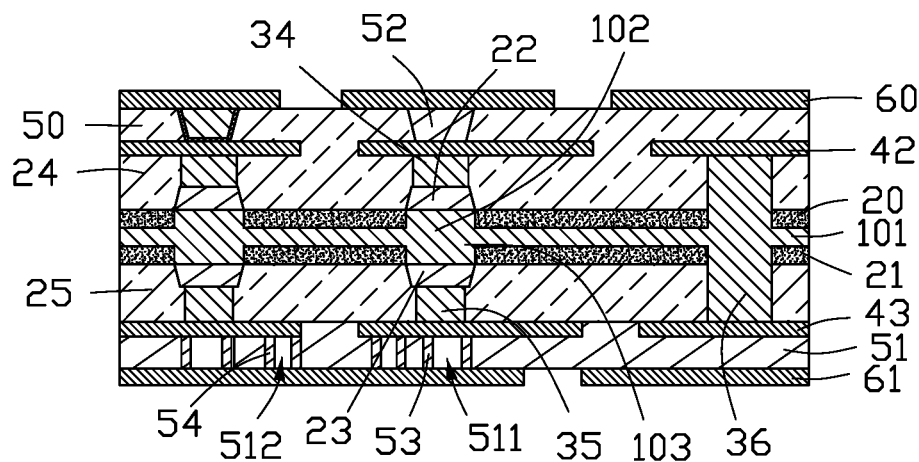
FIG. 11 is a diagrammatic view wherein a second wiring layer and a fifth wiring layer are respectively formed on the second insulating layer and the second metal layer of FIG. 10.

At step 11, referring to FIG. 11, a second wiring layer 60 and a fifth wiring layer 61 are formed on the second insulating layer 50 and the second metal layer 51, respectively.

In an embodiment, a third copper foil layer (not shown) and a fourth copper foil layer (not shown) are formed on the second insulating layer 50 and the second metal layer 51, respectively. The third copper foil layer and the fourth copper foil layer are then etched to form the second wiring layer 60 and the fifth wiring layer 61, respectively.

The second wiring layer 60 is in thermal conduction with the third heat conducting portion 52, so that the heat generated by the second wiring layer 60 can pass through the third heat conducting portion 52, the first wiring layer 42, the second heat conducting portion 34, and the first heat conducting portion 22 to the first metal layer 10. The first metal layer 10 can absorb the heat or dissipate the heat to the outside environment, so that the temperature of the second wiring layer 60 can be decreased. Furthermore, the third heat conducting portion 52 made of copper (or made of a mixture of copper and thermoelectric separation metal), the second heat conducting portion 34 made of thermoelectric separation metal, and the first heat conducting portions 22 made of copper are alternately arranged. Since the copper is lower in cost than the thermoelectric separation metal, the heat dissipation requirements can be meet while reducing the production cost.

The fifth wiring layer 61 is in thermal conduction with the third heat conducting member 53 and the fourth heat conducting member 54, so that the heat generated by the fifth wiring layer 61 can pass through the third heat conducting member 53, the fourth heat conducting portion 54, the fourth wiring layer 43, the second heat conducting member 35, and the first heat conducting member 23 to the first metal layer 10. The first metal layer 10 can absorb the heat or dissipate the heat to the outside environment, so that the temperature of the fifth wiring layer 61 can be decreased. Furthermore, the third heat conducting member 53 made of copper, the second heat conducting member 35 made of thermoelectric separation metal, and the first heat conducting member 23 made of copper are alternately arranged. Since the copper is lower in cost than the thermoelectric separation metal, the heat dissipation requirements can be meet while reducing the production cost.

Figure 12:
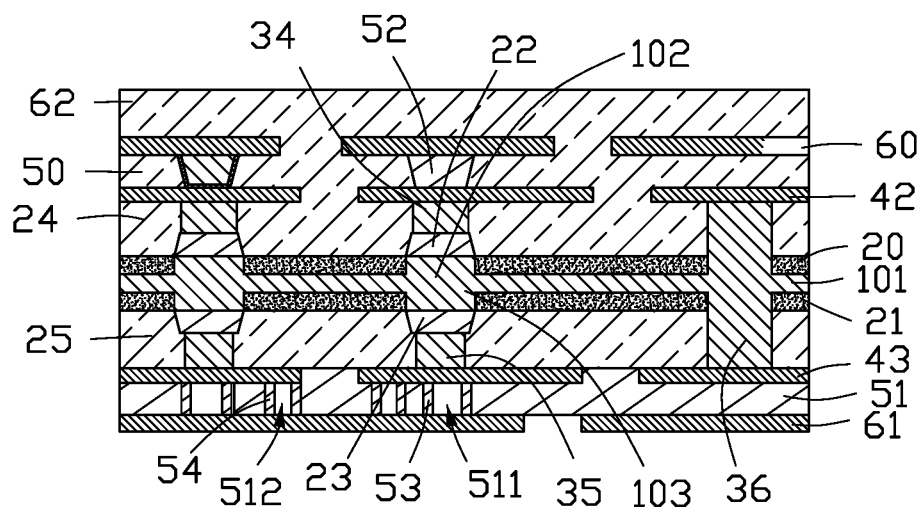
FIG. 12 is a diagrammatic view wherein a third insulating layer is formed on the second wiring layer of FIG. 11, to form a second intermediate body.

At step 12, referring to FIG. 12, a third insulating layer 62 is formed on the second wiring layer 60 to obtain a second intermediate body 70.

The third insulating layer 62 may be made of a material the same as that of the first insulating layer 24.

Figure 13:
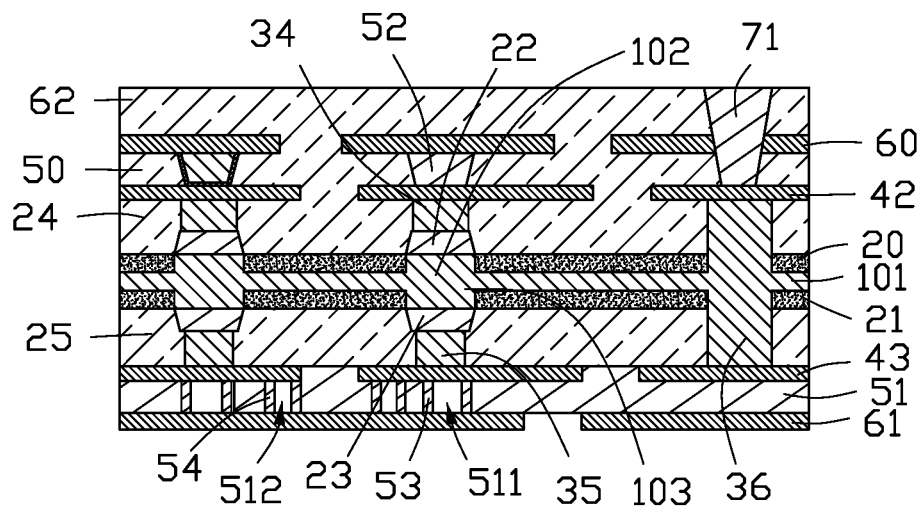
FIG. 13 is a diagrammatic view wherein an opening is defined in the second intermediate body and a second heat conducting channel is formed in the opening of FIG. 12.

At step 13, referring to FIG. 13, an opening (not shown) is defined in the second intermediate body 70. Copper is electroplated in the opening to form a second heat conducting channel 71.

The opening penetrates the third insulating layer 62, the second wiring layer 60 and the second insulating layer 50 in sequence, and a bottom of the opening corresponds to the first wiring layer 42. The opening is aligned with the through hole 33.

The second heat conducting channel 71 is in thermal conduction with the first wiring layer 42 and the second wiring layer 60.

Figure 14:
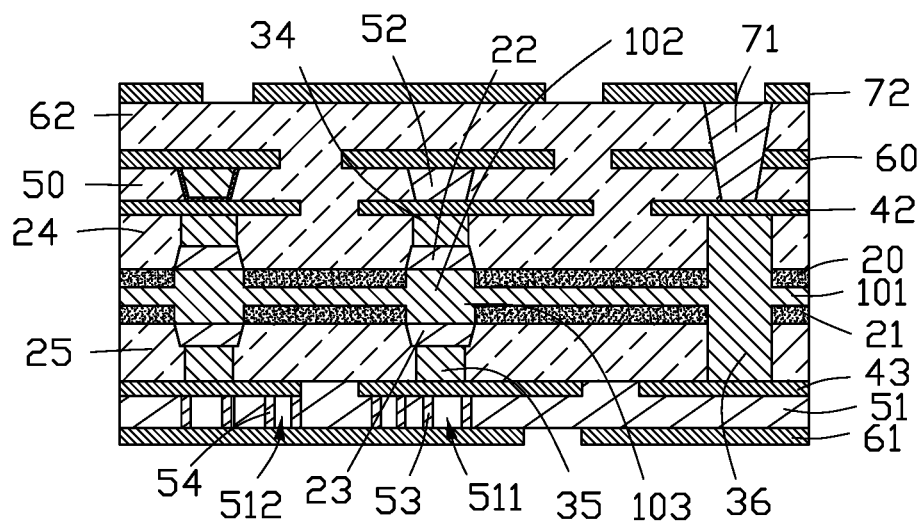
FIG. 14 is a diagrammatic view wherein a third wiring layer is formed on the third insulating layer of FIG. 13.

At step 14, referring to FIG. 14, a third wiring layer 72 is formed on the third insulating layer 62.

The third wiring layer 72 and the second wiring layer 60 are in thermal conduction with the second heat conducting channel 71, so that the heat generated by the third wiring layer 72 and the second wiring layer 60 can pass through the second heat conducting channel 71, the first wiring layer 42, and the first heat conducting channel 36 in sequence to the first metal layer 10. The first metal layer 10 can absorb the heat or dissipate the heat to the outside environment, so that the temperature of the third wiring layer 72 and the second wiring layer 60 can be decreased. At the same time, the second heat conducting channel 71 made of copper and the first heat conducting channel 36 made of thermoelectric separation metal are alternately arranged. Since the copper is lower in cost than the thermoelectric separation metal, the heat dissipation requirements can be meet while reducing the production cost.

Figure 15:
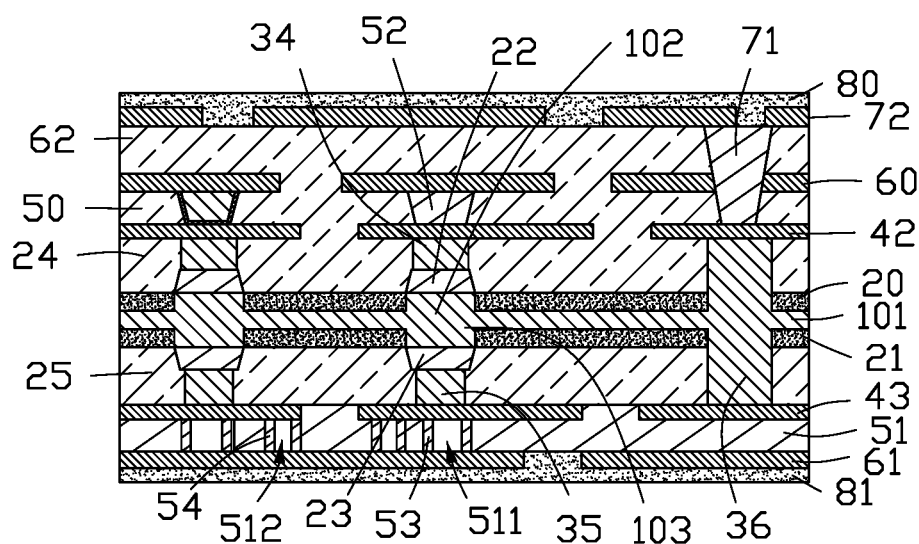
FIG. 15 is a diagrammatic view wherein a first solder resist layer and a second solder resist layer are respectively formed on the third wiring layer and the fifth wiring layer of FIG. 14.

At step 15, referring to FIG. 15, a first solder resist layer 80 and a second solder resist layer 81 are formed on the third wiring layer 72 and the fifth wiring layer 61, respectively. Thus, a circuit substrate 82 is obtained.

In an embodiment, the first solder resist layer 80 and the second solder resist layer 81 can be made of a solder resist ink (such as green oil). The first solder resist layer 80 can protect the third wiring layer 72, and the second solder resist layer 81 can the fifth wiring layer 61.

Figure 16:
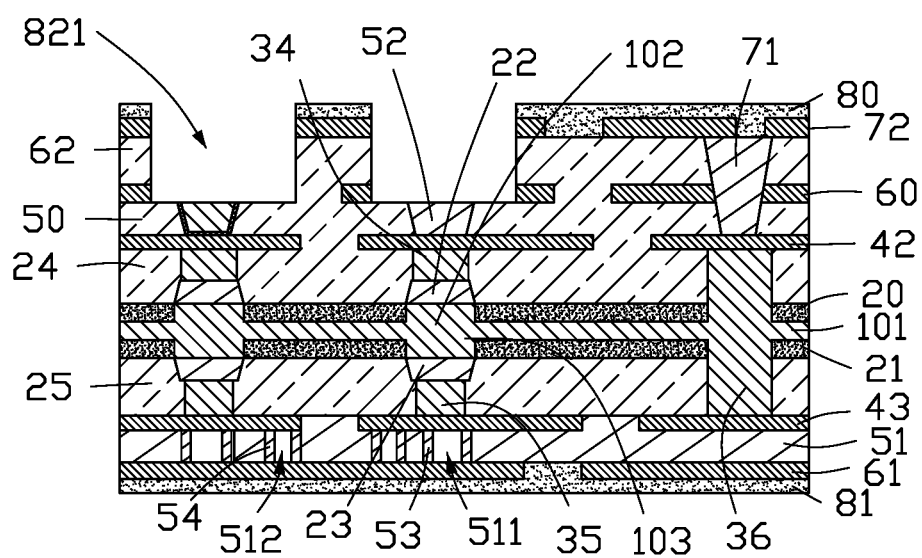
FIG. 16 is a diagrammatic view wherein the first solder resist layer, the third wiring layer, the third insulating layer, and the second wiring layer of FIG. 15 are cut.

At step 16, referring to FIG. 16, the first solder resist 80 is cut along a thickness direction of the circuit substrate 82 to obtain a groove 821.

The groove 821 penetrates the first solder resist layer 80, the third wiring layer 72, the third insulating layer 62, and the second wiring layer 60. The third heat conducting portion 52 is exposed from the groove 821. In an embodiment, the groove 821 may be cut according to a predetermined cutting depth.

Figure 17:
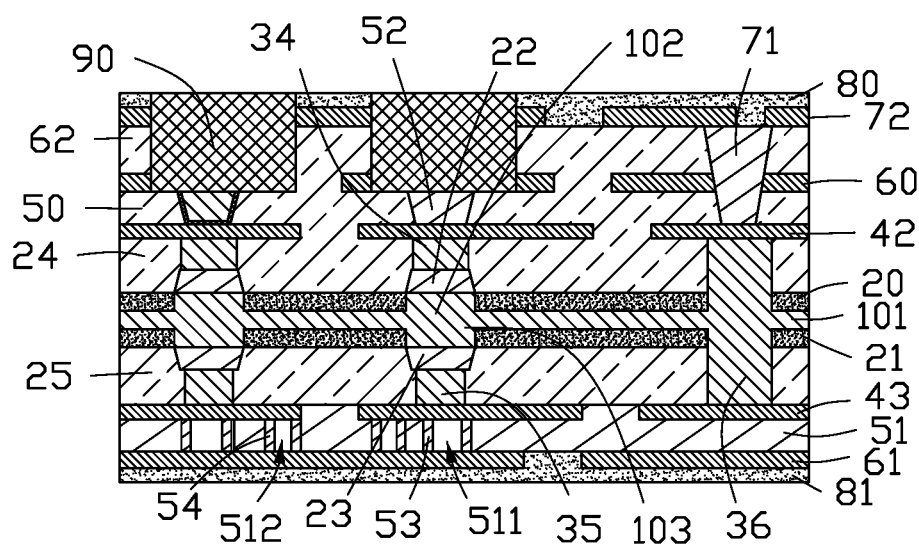
FIG. 17 is a diagrammatic view wherein an electronic component is installed in the groove of FIG. 16, to form a circuit board.

At step 17, referring to FIG. 17, an electronic component 90 is installed in the groove 821 to obtain the circuit board 100.

The electronic component 90 is in thermal conduction with the third heat conducting portion 52, so that the heat generated by the electronic component 90 can pass through the third heat conducting portion 52, the first wiring layer 42, the second heat conducting portion 34, and the first heat conducting portion 22 to the first metal layer 10. The first metal layer 10 can absorb the heat or dissipate the heat to the outside environment, so that the temperature of the electronic component 90 can be decreased.

Referring to FIG. 17, the present disclosure further provides an embodiment of a circuit board 100. The circuit board 100 includes a first metal layer 10, a first adhesive layer 20, a second adhesive layer 21, a first heat conducting portion 22, a first heat conducting member 23, a first insulating layer 24, a fourth insulating layer 25, a first wiring layer 42, a fourth wiring layer 43, a second insulating layer 50, a second metal layer 51, a second wiring layer 60, a fifth wiring layer 61, a third insulating layer 62, a third wiring layer 72, a first solder resist layer 80, a second solder resist layer 81, and an electronic component 90.

The first metal layer 10 includes a body 101, a number of first pillars 102, and a number of second pillars 103. The first pillars 102 and the second pillars 103 protrude from two opposite surfaces of the main body 101. A first slot 11 is defined between the main body 101 and two adjacent first pillars 102, and a second slot 12 is defined between the main body 101 and two adjacent second pillars 103. In an embodiment, the first pillars 102 and the second pillars 103 are aligned with each other in a thickness direction of the first metal layer 10.

In an embodiment, the first metal layer 10 is made of a thermoelectric separation metal. In an embodiment, the first metal layer 10 is aluminum nitride or potassium nitride. The first metal layer 10 has good thermal conductivity and certain electrical conductivity.

The first adhesive layer 20 and the second adhesive layer 21 are respectively disposed in the first slot 11 and the second slot 12.

The first heat conducting portion 22 and the first heat conducting member 23 are respectively disposed on the first pillar 102 and the second pillar 103. The first heat conducting portion 22 and the first heat conducting member 23 are both made of copper. The first heat conducting portion 22 is in thermal conduction with the first pillar 102, and the first heat conducting member 23 is in thermal conduction with the second pillar 103.

The first insulating layer 24 is disposed on the first adhesive layer 20 having the first heat conducting portion 22. A first blind hole 31 is defined in the first insulating layer 24. The first blind hole 31 penetrates the first insulating layer 24, and the bottom of the first blind hole 31 corresponds to the first heat conducting portion 22. The second heat conducting portion 34 is formed in the first blind hole 31. The second heat conducting portion 34 is made of the thermoelectric separation metal. The second heat conducting portion 34 is in thermal conduction with the first heat conducting portion 22.

The fourth insulating layer 25 is disposed on the second adhesive layer 21 having the first heat conducting member 23. The fourth insulating layer 25 defines a first blind groove 32. The first blind groove 32 penetrates the fourth insulating layer 25, and the bottom of the first blind groove 32 corresponds to the first heat conducting member 23. The second heat conducting member 35 is formed in the first blind groove 32. The second heat conducting member 35 is made of the thermoelectric separation metal. The second heat conducting member 35 is in thermal conduction with the first heat conducting member 23.

The circuit board 100 further defines a through hole 33. The through hole 33 penetrates the first insulating layer 24, the first adhesive layer 20, the main body 101, the second adhesive layer 21, and the fourth insulating layer 25 in sequence. The first heat conducting channel 36 is formed in the through hole 33. The first heat conducting channel 36 is made of the thermoelectric separation metal. The first heat conducting channel 36 is in thermal conduction with the main body 101.

The first wiring layer 42 is disposed on the first insulating layer 24. The first wiring layer 42 is in thermal conduction with the second heat conducting portion 34, so that the heat generated by the first wiring layer 42 can pass through the second heat conducting portion 34 and the first heat conducting portion 22 to the first metal layer 10.

The fourth wiring layer 43 is disposed on the fourth insulating layer 25. The fourth wiring layer 43 is in thermal conduction with the second heat conducting member 35, so that the heat generated by the fourth wiring layer 43 can pass through the second heat conducting member 35 and the first heat conducting member 23 to the first metal layer 10.

The second insulating layer 50 is disposed on the first wiring layer 42. A second blind hole 501 is defined in the second insulating layer 50. The second blind hole 501 penetrates the second insulating layer 50, and the bottom of the second blind hole 501 corresponds to the first wiring layer 42. The second blind hole 501 corresponds to the first blind hole 31. The third heat conducting portion 52 is formed in the second blind hole 501. The third heat conducting portion 52 is made of copper.

The second metal layer 51 is disposed on the fourth wiring layer 43. The second metal layer 51 is in thermal conduction with the fourth wiring layer 43. In an embodiment, the second metal layer 51 is made of the thermoelectric separation metal.

The second metal layer 51 defines a second blind groove 511 and a third blind groove 512. The second blind groove 511 penetrates the second metal layer 51, and the bottom of the second blind groove 511 corresponds to the fourth wiring layer 43. The second blind groove 511 corresponds to the first blind groove 32. The third blind groove 512 penetrates the second metal layer 51, and the bottom of the third blind groove 512 corresponds to the fourth wiring layer 43. The third blind groove 512 and the first blind groove 32 are staggered with each other. The third heat conducting member 53 and the fourth heat conducting portion 54 are respectively formed in the second blind groove 511 and the third blind groove 512. The third heat conducting member 53 and the fourth heat conducting portion 54 are both made of copper.

As shown in FIG. 17, the electroplated copper completely infills one second blind holes 501 to form the third heat conducting portion 52. The electroplated copper is only disposed on the sidewall and the bottom of the second blind hole 501. As such, the thermoelectric separation metal can further infill the second blind hole 501 having the electroplated copper, so that the electroplated copper and the thermoelectric separation metal in the second blind hole 501 cooperatively form the third heat conducting portion 52. The third heat conducting portion 52 is in thermal conduction with the first wiring layer 42.

In an embodiment, the third heat conducting member 53 is disposed on the sidewall of the second blind groove 511. The third heat conducting member 53 is in thermal conduction with the fourth wiring layer 43.

In an embodiment, the fourth heat conducting portion 54 is disposed on the sidewall of the third blind groove 512. The fourth heat conducting portion 54 is in thermal conduction with the fourth wiring layer 43.

The second wiring layer 60 is disposed on the second insulating layer 50. The second wiring layer 60 is in thermal conduction with the third heat conducting portion 52, so that the heat generated by the second wiring layer 60 can pass through the third heat conducting portion 52, the first wiring layer 42, the second heat conducting portion 34, and the first heat conducting portion 22 to the first metal layer 10.

The fifth wiring layer 61 is disposed on the second metal layer 51. The fifth wiring layer 61 is in thermal conduction with the third heat conducting member 53 and the fourth heat conducting member 54, so that the heat generated by the fifth wiring layer 61 can pass through the third heat conducting member 53, the fourth heat conducting portion 54, the fourth wiring layer 43, the second heat conducting member 35, and the first heat conducting member 23 to the first metal layer 10.

The third insulating layer 62 is disposed on the second wiring layer 60.

The circuit board 100 further defines an opening (not shown). The opening penetrates the third insulating layer 62, the second wiring layer 60, and the second insulating layer 50 in sequence, and the bottom of the opening corresponds to the first wiring layer 42. The opening corresponds to the through hole 33. The second heat conducting channel 71 is formed in the opening. The second heat conducting channel 71 is made of copper. The second heat conducting channel 71 is in thermal conduction with the first wiring layer 42 and the second wiring layer 60.

The third wiring layer 72 is formed on the third insulating layer 62. The third wiring layer 72 and the second wiring layer 60 are in thermal conduction with the second heat conducting channel 71, so that the heat generated by the third wiring layer 72 and the second wiring layer 60 can pass through the second heat conducting channel 71, the first wiring layer 42, and the first heat conducting channel 36 in sequence to the first metal layer 10.

The first solder resist layer 80 and the second solder resist layer 81 are respectively disposed on the third wiring layer 72 and the fifth wiring layer 61. The first solder resist layer 80 and the second solder resist layer 81 can be made of a solder resist ink.

The circuit board 100 also defines a groove 821. The groove 821 penetrates the first solder resist layer 80, the third wiring layer 72, the third insulating layer 62, and the second wiring layer 60. The third heat conducting portion 52 is exposed from the groove 821. The electronic component 90 is disposed in the groove 821. The electronic component 90 is in thermal conduction with the third heat conducting portion 52, so that the heat generated by the electronic component 90 can pass through the third heat conducting portion 52, the first wiring layer 42, the second heat conducting portion 34, and the first heat conducting portion 22 to the first metal layer 10.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a circuit board, comprising:
   providing a first metal layer, the first metal layer comprising a main body and at least two first pillars protruding from the main body, a first slot defined among the main body and adjacent two of the first pillars;
   forming a first adhesive layer in the first slot;
   electroplating copper on each of the first pillars to form a first heat conducting portion, causing the first heat conducting portion to be in thermal conduction with the first pillar;
   forming a first insulating layer on the first adhesive layer having the first heat conducting portion, and defining a first blind hole in the first insulating layer;
   filling the first blind hole with thermoelectric separation metal to form a second heat conducting portion, causing the second beat conducting portion to be in thermal conduction with the first heat conducting portion;
   forming a first wiring layer on the first insulating layer, causing the first wiring layer to be in thermal conduction with the second heat conducting portion;
   forming a second insulating layer on the first wiring layer, defining a second blind hole on the second insulating layer, and the second blind hole corresponding to the first blind hole;
   electroplating copper in the second blind hole to form a third heat conducting portion, causing the third heat conducting portion to be in thermal conduction with the first wiring layer; and
   mounting an electronic component on the second insulating layer, causing the electronic component to be in thermal conduction with the third heat conducting portion, thereby obtaining the circuit board.

2. The method of claim 1, wherein after forming the third heat conducting portion, the method further comprises:
   forming a second wiring layer, a third insulating layer, and a third wiring layer on the second insulating layer in that order to obtain a circuit substrate; and
   cutting the third wiring layer along a thickness direction of the circuit substrate to form a groove, the groove penetrating the third wiring layer, the third insulating layer, and the second wiring layer, wherein the third heat conducting portion is exposed from the groove, and the electronic component is disposed in the groove.

3. The method of claim 2, wherein the first metal layer further comprises at least two second pillars protruding from the main body, the second pillars and the first pillars are disposed on two opposite surfaces of the main body, a second slot is defined among the main body and adjacent two of the second pillars, and the method further comprises:
   forming a second adhesive layer in the second slot;
   electroplating copper on each of the second pillars to form a first heat conducting member, causing the first heat conducting member to be in thermal conduction with the second pillar;
   forming a fourth insulating layer on the second adhesive layer and the first heat conducting portion, and defining a first blind groove in the fourth insulating layer;
   filling thermoelectric separation metal in the first blind groove to form a second heat conducting portion, causing the second heat conducting portion to be in thermal conduction with the first heat conducting portion;
   forming a fourth wiring layer on the fourth insulating layer, causing the fourth wiring layer to be in thermal conduction with the second heat conducting portion;
   forming a second metal layer on the fourth wiring layer, causing the second metal layer to be in thermal conduction with the fourth wiring layer;
   defining a second blind groove in the second metal layer, the second blind groove aligned with the first blind groove;
   electroplating copper on a sidewall of the second blind groove to form a third heat conducting portion, causing the third heat conducting portion to be in thermal conduction with the fourth wiring layer; and
   forming a fifth wiring layer on the second metal layer, causing the fifth wiring layer to be in thermal conduction with the second metal layer and the third heat conducting portion.

4. The method of claim 3, wherein after defining the second blind groove in the second metal layer, the method further comprises:

defining a third blind groove in the second metal layer, the third blind groove and the first blind groove staggered with each other; and electroplating copper on a sidewall of the third blind groove to form a fourth heat conducting portion, causing the fourth heat conducting portion to be in thermal conduction with the fourth wiring layer and the fifth wiring layer.

5. The method of claim 3, wherein a first intermediate is obtained after forming the first insulating layer, and a second intermediate is obtained after forming the third insulating layer, the method further comprises:

defining a through hole in the first intermediate body;

filling thermoelectric separation metal in the through hole to form a first heat conducting channel, causing the first heat conducting channel to be in thermal conduction with the first wiring layer and the fourth wiring layer;

defining an opening in the second intermediate body, the opening penetrating the third insulating layer, the second wiring layer, and the second insulating layer, and a bottom of the opening corresponding to the first wiring layer, the opening aligned with the through hole;

electroplating copper in the opening to form a second heat conducting channel, causing the second heat conducting channel to be in thermal conduction with the first wiring layer and the second wiring layer, wherein the second heat conducting channel is also in thermal conduction with the third wiring layer.

6. The method of claim 3, wherein the first pillars and the second pillars are aligned with each other in a thickness direction of the first metal layer.

7. The method of claim 3, wherein a surface of the first adhesive layer away from the main body is flush with a surface of the first pillars away from the main body; a surface of the second adhesive layer away from the main body is flush with a surface of the second pillars away from the main body.

8. The method of claim 3, wherein the second metal layer is made of thermoelectric separation metal.

9. The method of claim 1, wherein the electroplated copper is disposed on a sidewall and a bottom of the second blind hole, the method further comprises:

filling thermoelectric separation metal in the second blind hole having the electroplated copper, wherein the electroplated copper and the thermoelectric separation metal in the second blind hole cooperatively form the third heat conducting portion.

10. The method of claim 1, wherein the thermoelectric separation metal is aluminum nitride or potassium nitride.

* * * * *